United States Patent
Makino

[19]

[11] Patent Number: 6,046,634
[45] Date of Patent: Apr. 4, 2000

[54] AMPLIFIER CIRCUIT EMPLOYING FLOATING ERROR CANCELLATION

[75] Inventor: Jun Makino, Singapore, Singapore

[73] Assignee: Majeel Laboratories, Pte, Ltd.

[21] Appl. No.: 09/160,687

[22] Filed: Sep. 25, 1998

[30] Foreign Application Priority Data

Sep. 27, 1997 [SG] Singapore ......................... 9703598-4

[51] Int. Cl.$^7$ .................................................. H03F 3/00
[52] U.S. Cl. ................................................. 330/146; 330/69
[58] Field of Search .......................... 330/146, 69, 149; 381/120, 121

[56] References Cited

U.S. PATENT DOCUMENTS

| | | | |
|---|---|---|---|
| 4,321,428 | 3/1982 | Seki | 179/1 A |
| 4,721,919 | 1/1988 | LaRosa et al. | 330/146 |
| 4,758,769 | 7/1988 | Verhoeven et al. | 330/84 |
| 5,939,938 | 8/1999 | Kalb et al. | 330/51 |

*Primary Examiner*—Robert Pascal
*Assistant Examiner*—Henry Choe

[57] ABSTRACT

The present amplifier circuit employing floating error-cancellation technique eradicates errors and distortions by canceling them out at the speaker terminal. The circuit utilizes reference, main power, and error suspension amplifiers. The reference amplifier is a small signal amplifier with unity or near unity gain. The main function of the buffer amplifier is to provide a reference signal to be used to isolate the error signal. The main power amplifier is an inverting power amplifier without negative feedback, and whose main function is amplify the audio signal. The error suspension amplifier is a non-inverting power amplifier whose function is amplify the isolated error signal and provide an error potential to a speaker terminal so that the error can be canceled out at the speaker load.

12 Claims, 9 Drawing Sheets

AMPLIFIER CIRCUIT EMPLOYING FLOATING ERROR CANCELLATION

FIELD OF THE INVENTION

The present invention relates generally to the field of amplifiers, and more particularly to a high-fidelity, error-canceling, audio amplifier circuit.

BACKGROUND OF THE INVENTION

Any music lover or sound engineer can appreciate the importance of having a good audio amplifier in any high-fidelity stereo system. A good amplifier typically has good physical characteristics, i.e., good frequency response, low distortion, etc. and/or delivers good sound quality. Having good physical characteristics, however, does not necessarily lead to producing sound of good quality. While sound quality is not as easily measurable or quantifiable like the physical characteristics, it is a well-known fact that an amplifier with good physical characteristics still may not yield good sound quality due apparently to errors or distortions which are not easily observable from studying the amplifier's physical characteristics. The reasons for this phenomenon and the solutions for it, however, are not fully understood at this point. See, e.g., U.S. Pat. No. 4,809,336 and U.S. Pat. No. 5,467,400.

There are different types of high-fidelity amplifiers in the market. But most notably, the types can be broadly differentiated as having either vacuum tubes or solid state devices such as transistors. For the transistor-based amplifiers, many of them employ an overall negative-feedback (NFB) topology which is a well known scheme to those skilled in the art. Each of these types has advantages and disadvantages. For instance, it is generally known that the transistor-based amplifiers employing NFB topology have good physical characteristics when compared to the vacuum tube transistors. Some expensive vacuum tube amplifiers have much worse total harmonic distortion (THD) and narrower frequency range, for example. On the other hand, many people believe that the vacuum tube amplifiers still deliver better sound quality. Similarly, some of the well-designed transistor-based amplifiers which do not employ the NFB topology have poorer physical characteristics, but are still touted as producing higher quality sounds.

While it would be easy to point to the NFB topology as the cause of the poorer sound quality, the exact cause and nature of sound degradation are still not fully understood. And although the understanding in regard to the phenomenon of sound quality versus physical characteristics is incomplete, it is clear that the ideal is to have an amplifier which has good physical characteristics and still delivers good sound quality. However, the industry has had difficulty developing an amplifier which meets both criteria.

OBJECTS OF THE INVENTION

It is therefore the object of the present invention to generally overcome the shortcomings stated above and in particular to provide an amplifier circuit which yields both good physical characteristics and good sound quality.

It is another object of the present invention to provide an amplifier circuit which can utilize either vacuum tube or solid state transistors without unduly affecting performance.

SUMMARY OF THE INVENTION

The present invention employing the floating error-cancellation technique eradicates errors and other imperfections in the signal such as THD and other distortions, offsets, etc., by canceling out the errors and the imperfections at the speaker load. This is accomplished partly by 'floating' the speaker terminal which is connected to a signal ground under conventional amplifier designs.

The preferred embodiment of the present invention utilizes three amplifiers, buffer, main power, and error suspension amplifiers. The buffer or reference amplifier X1 is a small signal amplifier with unity or near unity gain. The main function of the buffer amplifier is to provide a reference signal to be used to isolate the error signal. The main power amplifier X2 is an inverting power amplifier without NFB, and whose main function is amplify the audio signal. The error suspension amplifier X3 is a non-inverting power amplifier whose function is amplify the isolated error signal and to provide the error potential to the speaker terminal so that the error can be canceled out at the speaker terminal.

The reference amplifier provides a reference signal which is substantially identical to the incoming audio signal. The reference signal is fed to the negative input of the power amplifier which amplifies and inverts the signal to yield the inverted main signal. Due to the relatively large gain (in the order of 10 times for a typical audio amplifier), some errors will be introduced in the output. Since the output of X2 is an inverted image of the output of X1, a mix of the two signals will essentially cancel each other out leaving only the error signal. However, since the amplitude of the original or the reference signal, the output from X1, will be much smaller than the amplified signal from the output of X2, the amplitudes are normalized by simply selecting the proper values for the resistors R1 and R2.

The isolated error signal is then fed to the positive input of the non-inverting error suspension amplifier. Due to the amplitude normalization process, the isolated error signal will not have the same amplitude as the error in the amplified signal at the output of X2. Hence, the error suspension amplifier X3 is used to amplify the isolated error signal to match the error signal from the output of X2. This amplified isolated error signal, or simply "error-canceling signal", is then fed to a terminal, the "floating terminal", of a speaker and the amplified signal from the power amplifier X2 is fed to the other terminal of the speaker. Although this signal from X2 carries with it the error, it is offset or canceled out at the terminal, as both terminals will carry the same error potential. Hence, the potential difference between terminals will yield an output signal which is proportional to the signal potential without the error.

BRIEF DESCRIPTION OF THE DRAWINGS

FIG. 3b is a the error-cancellation signal resulting from amplifying the isolated error signal from FIG. 3a.

DETAILED DESCRIPTION OF THE INVENTION

Generally, the present invention employing the floating error-cancellation technique eradicates errors and other imperfections in the signal such as THD and other distortions, offsets, etc., by canceling out the errors and the imperfections at the speaker load. This is accomplished partly by 'floating' the speaker terminal which is connected to a signal ground under conventional amplifier designs. Hence, instead of having the usual ground potential, the floating speaker terminal has the 'error potential' which essentially cancels out the error at the speaker terminal.

Figure 1:
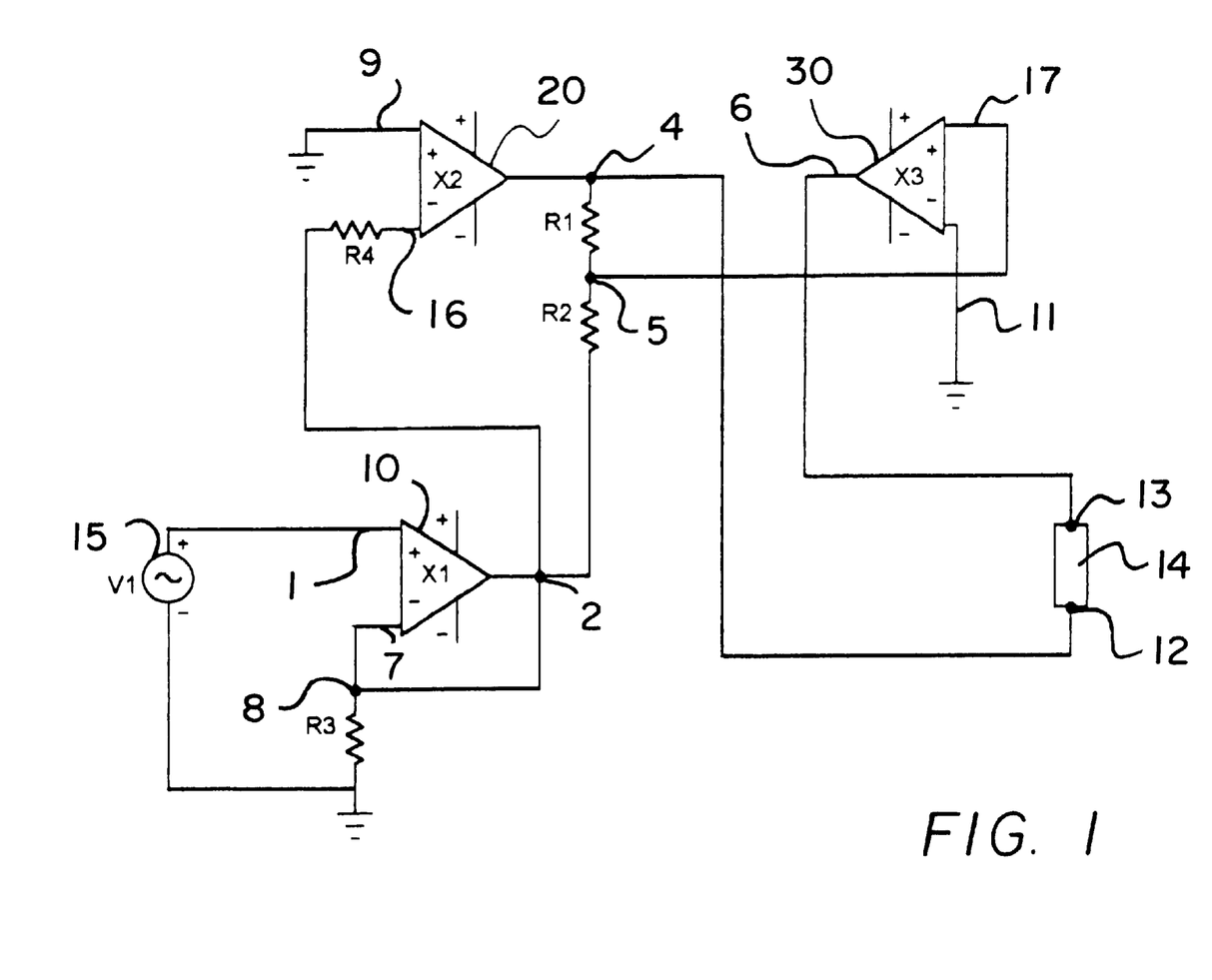
FIG. 1 is a block diagram illustrating the preferred embodiment of the present amplifier circuit.

More specifically, reference is made to FIG. 1 which is a block diagram illustrating the preferred embodiment of the present invention. As can be seen in the diagram, three amplifiers each performing a separate function are used. The buffer or reference amplifier X1, 10, is a small signal amplifier with unity or near unity gain. The main function of the buffer amplifier 10 is to provide a reference signal to be used to isolate the error signal. The main power amplifier X2, 20, is an inverting power amplifier without the NFB, and whose main function is amplify the audio signal. The error suspension amplifier X3, 30, is a non-inverting power amplifier whose function is to amplify the isolated error signal and to provide the error potential to the speaker terminal so that the error can be canceled out at the speaker terminal.

Referring further to FIG. 1, the audio signal to be amplified is represented by V1, 15, which is connected to the input of amplifier X1 at the point 1 and to the ground. The negative input 7 of amplifier X1 is connected to the ground via resistor R3. The amplifier X1 outputs a reference signal at point 2 which is fed back to the negative input 7 at point 8 providing a negative feedback topology. Because X1 is a reference amplifier, no amplification occurs. The signal at the output 2 is pristine and the output impedance is low.

Still referring to FIG. 1, the reference signal at the output 2 of amplifier X1 is essentially the same as the signal V1, which is the signal to be amplified. The reference signal is, hence, fed to the negative input 16 of the amplifier X2, 20, via the resistor R4. The positive input 9 of the X2 is tied to a ground. The output 4 of the amplifier X2 is connected to the output 2 of the amplifier X1 via the resistors R1 and R2 effecting a mix of the respective output signals at point 5. The output 4 of X2 which carries the amplified inverted main signal is fed to the load, in this case a speaker, at point 12, which is one of the two terminals for the speaker 14. Note that the output 4 of X2 does not feed back to the negative input 16 of X2. Hence, negative feedback topology is not used in the main power amplifier X2.

The mix of the output of amplifiers X1, the reference signal, and the output of amplifiers X2, the inverted main signal, at point 5 yields isolated error signal which is fed to the positive input 17 of the error suspension amplifier X3, 30. The negative input 11 of X3 is tied to a ground. The output 6 of the amplifier X3 is connected to the second terminal 13 of the speaker 14 to provide the error-canceling signal.

Figure 3A:
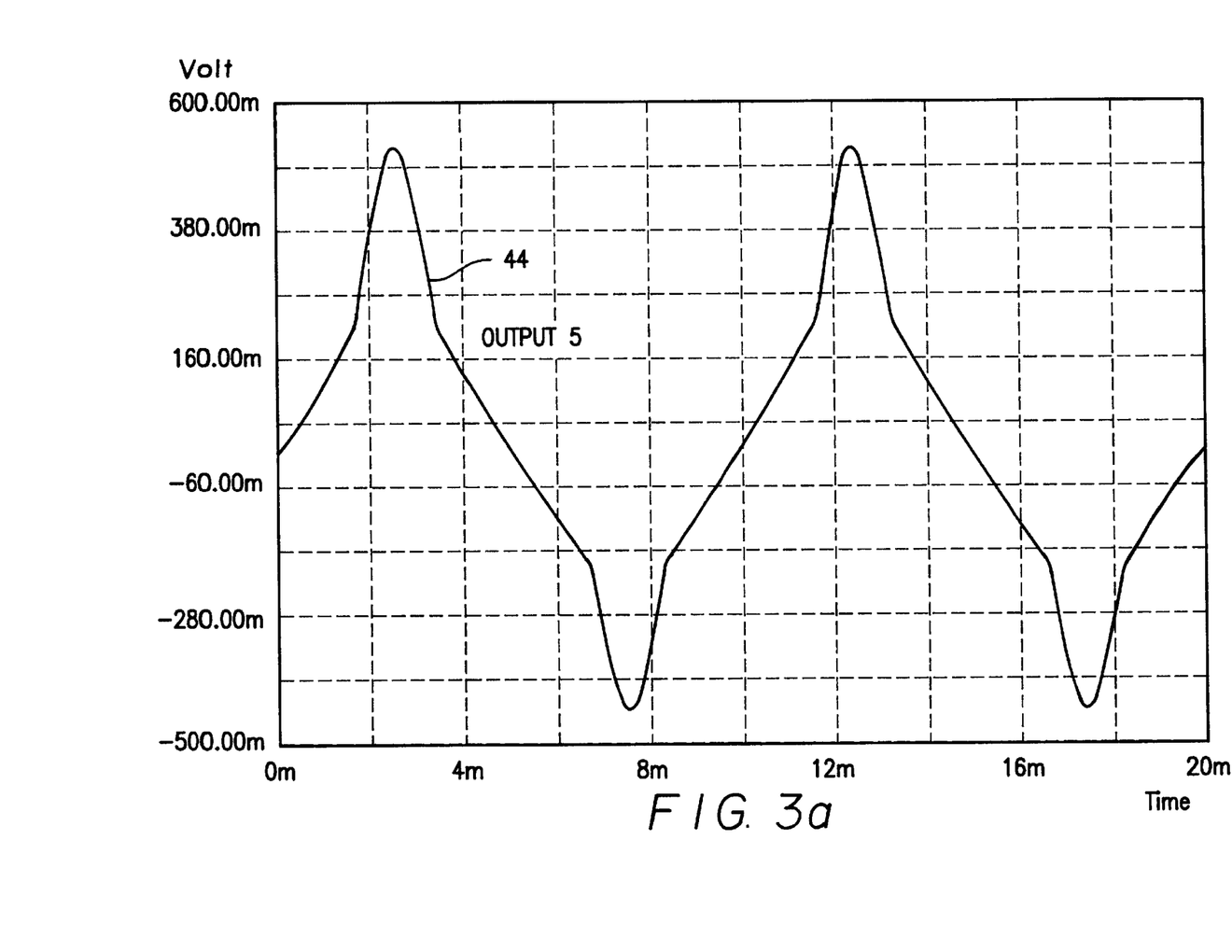
FIG. 3a is the resulting isolated error signal from mixing the output signals of FIG. 2.
Figure 3B:
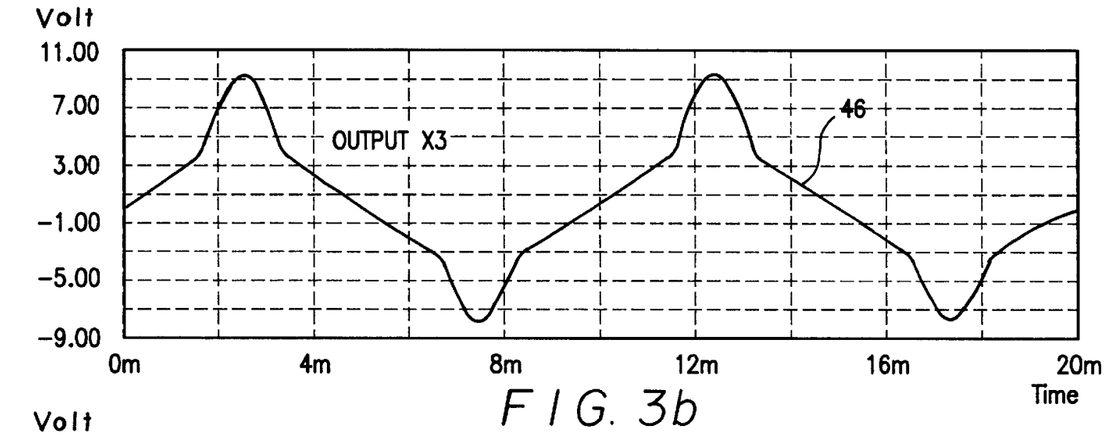
Figure 3C:
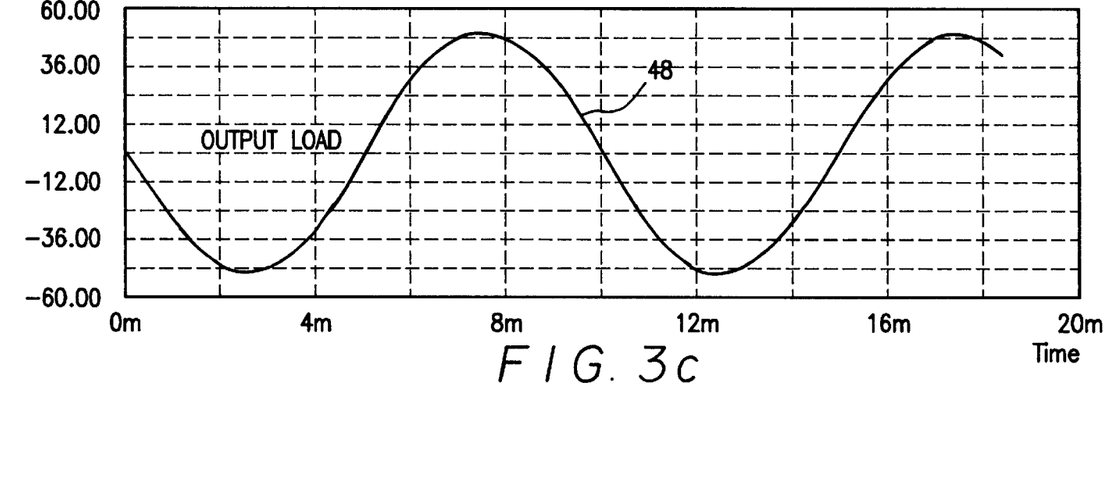
FIG. 3c is the resulting output signal at the load by feeding the signal from FIG. 3b and the main signal from the amplifier X2 to the load terminals.
Figure 4:
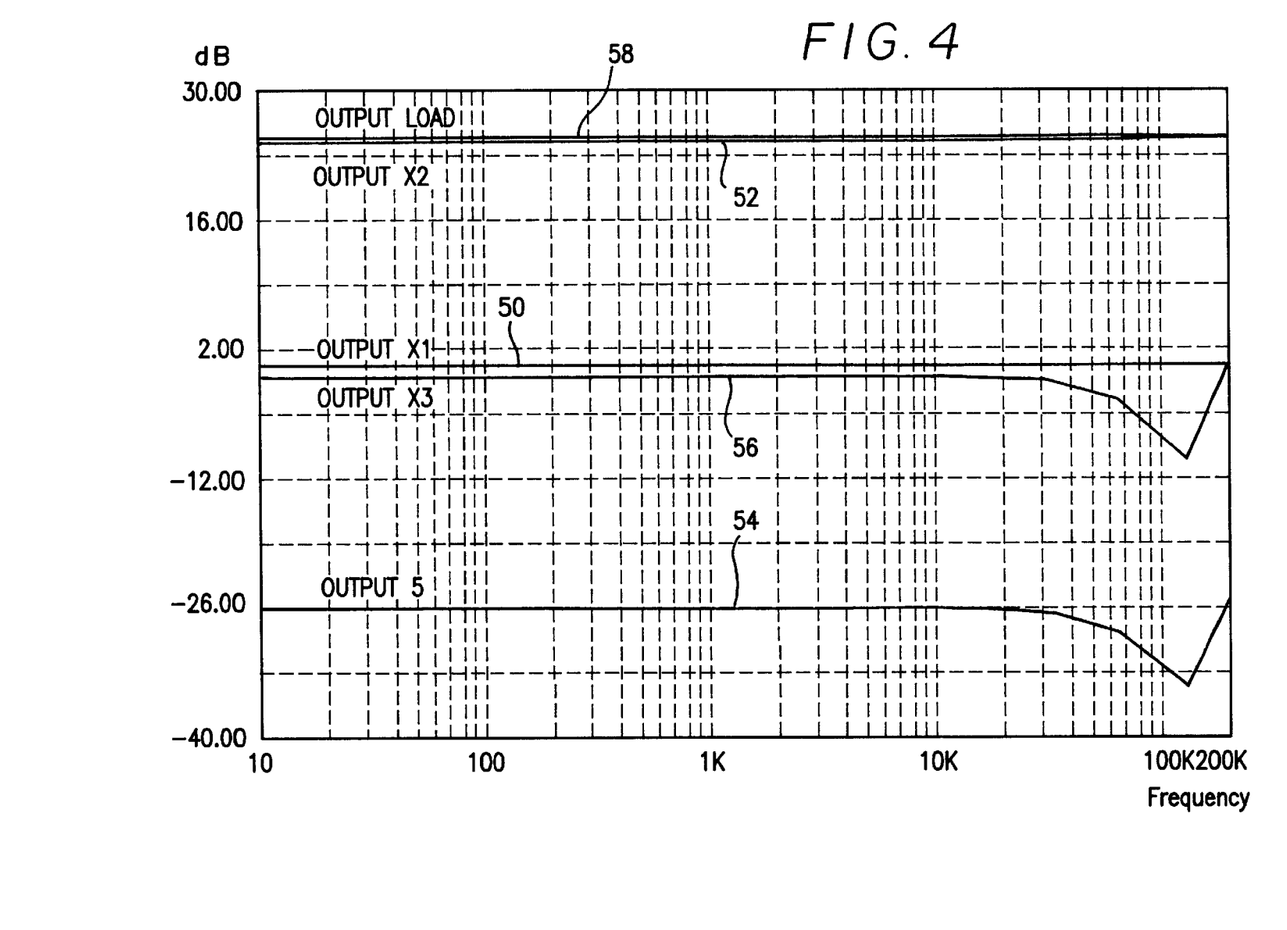
FIG. 4 illustrates the sample signals at the various points of the circuit for a situation where the distortion during the amplification process is frequency related.

Now through the use of the graphs presented in FIGS. 2 through 4, the process by which the circuit described above cancels the error in the amplified signal will be described in greater detail. For illustration purposes, the sample signals used in FIGS. 2 and 3 will be a simple sinusoidal wave.

Figure 2:
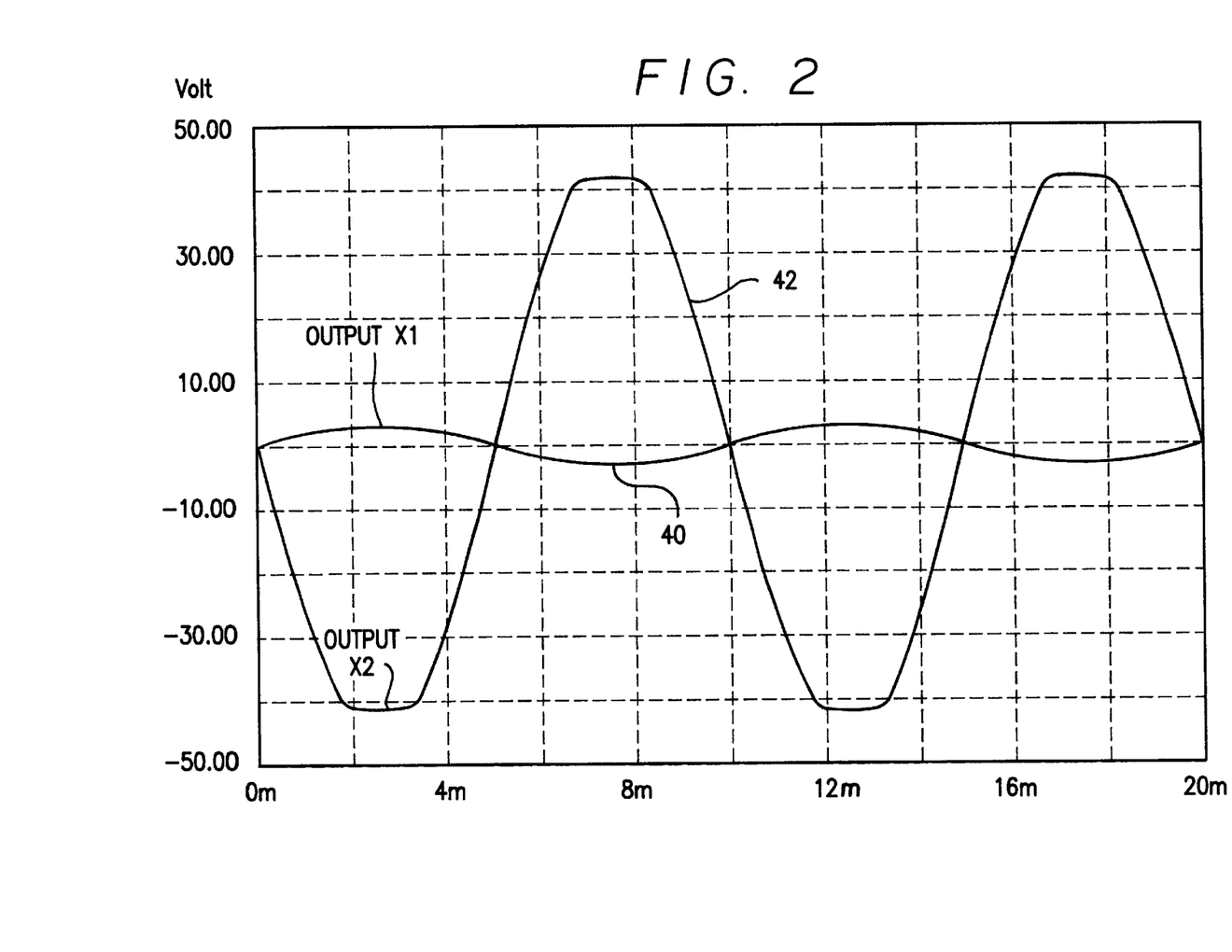
FIG. 2 is a sample output signals for amplifiers X1 and X2.

FIG. 2 shows a simple sinusoidal wave 40 representing the audio signal V1, and which also represents the reference signal, the output from the amplifier X1 of the circuit from FIG. 1, since X1 is a unity gain amplifier. This signal 40 is fed to the negative input 16 of the power amplifier 16 which amplifies and inverts the signal to yield the inverted main signal 42 as also shown in FIG. 2. Due to the relatively large gain (in the order of 10 times for a typical audio amplifier), some errors will be introduced to the output signal, but which may or may not be easily observable. In either case (whether the error is observable or not), the present circuit's ability to cancel the error signal is unaffected. Since the output 4 of X2 is an inverted image of the output 2 of X1, a mix of the two signals will essentially cancel each other out leaving only the error signal. However, since the amplitude of the original or the reference signal, the output 2 from X1, will be much smaller than the amplified signal from the output 4 of X2, the amplitudes are normalized by simply selecting the proper values for the resistors R1 and R2.

For example, given a gain of 10 for the power amplifier X2, the values for R1 and R2 can be selected as 1 Ohm and 9 Ohms, respectively. With the proper values for R1 and R2 chosen, the mix of the two outputs yields an isolated error signal at point 5 in the circuit in FIG. 1. A sample isolated error signal 44 resulting from the mix of the reference signal 40 and inverted main signal 42 is shown in FIG. 3a.

The isolated error signal is then fed to the positive input 17 of the non-inverting error suspension amplifier 30. Due to the amplitude normalization process, the isolated error signal will not have the same amplitude as the error in the amplified signal at the output 4. It is important to set the amplitude the same as the isolated error signal will be used to cancel out the error signal from the main signal. Hence, the error suspension amplifier X3 is used to amplify the isolated error signal to match the error signal from the output 4 of X2. This amplified isolated error signal, or simply "error-canceling signal", is then fed to the terminal 13, the "floating terminal", of the speaker 14. A sample error-canceling signal 46 resulting from the amplification of the isolated error signal 44 is shown in FIG. 3b. Note that signals 42 and 44 have substantially identical shape. Although it is true that some distortion will be introduced during the amplification process in the error suspension amplifier X3, this will be negligible because the isolated error signal 44 is relatively small.

The amplified signal from the power amplifier X2 is fed to the terminal 12 of the speaker. Although this signal carries with it the error, it is offset or canceled out at the terminal because terminal 13 will carry the error-canceling signal 44, and therefore, a potential substantially identical to the error potential found in the main signal. While it is true that the error-canceling signal 44 will not be completely identical to the error signal found in the main signal (as mentioned above), the difference is negligible for audio purposes. Hence, the potential difference between terminals 12 and 13 will yield an output signal 48 which is proportional to the signal potential without the error, as shown in FIG. 3C.

Although here it was shown that the signal inversion was accomplished by the main power amplifier, which is the preferred method, it should be clear that the signal inversion may be accomplished by a different amplifier, e,g., the reference amplifier. Of course, the circuit would still need to provide a means for providing a non-inverted reference signal. One way to achieve this is by simply providing another reference amplifier. Of course, a number of other variations and means are possible.

The present circuit is able to cancel out various types of errors or distortions. While the above example showed a case where the error did not affect the frequency of the signal, the present circuit can correct, for instance, frequency-related errors as well. For example, the flat line 50 in FIG. 4 represents the incoming signal to be amplified, the output of amplifier X1. For example, the amplified signal 52 at the output 4 of amplifier X2 shows an imperfect frequency response at the higher frequencies. The resulting isolated error signal 54 and error-canceling signal 56, thus, have the shape as shown in the figure. The result at the terminal, however, yields an error-free signal output 58.

Although the description given above is sufficient for one of ordinary skilled in the art to make and use the present invention, a more formal description of the principles utilized shall be provided herein as a way of providing further details.

As explained above, the output signal of X2, point 4, and output signal of X1, point 2, are mixed through R1 and R2 at point 5. The values of R1 and R2 can be set as follows:

$$\frac{R1}{R2} = \frac{G_v X2}{G_v X1}$$

where $G_v$ is the voltage gain of X1 and $G_v X2$ is the voltage gain of X2

If $G_v X1$ is set to 1, then it follows that $$R1 = R2 * G_v X2. \quad (1)$$

The signal at point 5 is fed to the positive input 17 of X3, where the voltage gain of X3, $G_v X3$, follows the following formula:

$$G_v X3 = \frac{R1 + R2}{R2} \quad (2)$$

Now the output of X2, point 4, and the output of X3, point 6, are connected to the speaker terminals. Assume now that the original signal, V1, from the buffer amplifier X1 is V1=f(t). The output signal, V2, at the output 2 of X1 is then V2=f(t) since X1 is a small signal amplifier with unity gain and so the input signal can be assumed to be equal to the output signal. Now, using the formulas given above, the signal, V4, at the output 4 of X2 can be s represented as follows:

$$V4 = G_v X2 * f(t) + a * f(2t) + b * f(3t) + c * f(4t) + \ldots + y * f(zt) + dc \text{ offset} + \text{noise}$$

where a*f(2t)+b*f(3t)+c*f(4t)+y*f(zt) represents harmonic distortions

For simplicity, the spurious signals after the $G_v X2 * f(t)$ term can be grouped and called "error" or "error signal". The above formula can be rewritten as $$V4 = G_v X2 * f(t) + \text{error} \quad (3)$$

By using the well-known Superposition Principle, the signal at point 5, V5, can be represented as the following:

$$V5 = V2 * \frac{R1}{R1 + R2} + V4 * \frac{R2}{R1 + R2} \quad (4)$$

Substituting (1) and (3) into (4) yields, $$V5 = \frac{R1 * f(t) - R2 * G_v X2 * f(t)}{R1 + R2} + \text{error} * \frac{R2}{R1 + R2}$$

$$= \frac{R2 * G_v X2 * f(t) - R2 * G_v X2 * f(t)}{R1 + R2} + \text{error} * \frac{R2}{R1 + R2}$$

$$= \text{error} * \frac{R2}{R1 + R2}$$

The signal at point 6, V6, is given by the following:

$$V6 = \text{error} * \frac{R2}{R1 + R2} * G_v X3 \quad (5)$$

Substituting (2) into (5) yields, $$V6 = \text{error} * \frac{R2}{R1 + R2} * \frac{R1 + R2}{R2}$$

$$= \text{error}$$

The signal applied across the speaker terminal is then given by the following:

$$S_{load} = \text{signal at point } \mathbf{4} - \text{signal at point } \mathbf{6}$$

$$= V4 - V6$$

$$= G_v X2 * f(t) + \text{error} - \text{error}$$

$$= G_v X2 * f(t)$$

Therefore, the terminals at the speaker carries a signal proportional to the original signal V1 without any error!

The advantages of the present amplifier circuit are versatility, absence of NFB related distortions and errors, and good amplifier characteristics. Because the current circuit does not utilize NFB for power amplification, the main power amplifier and the error suspension amplifier may be solid state or tube amplifiers without unduly affecting the performance. In addition, present circuit is able to produce quality sound similar to that found in tube amplifiers without sacrificing the physical characteristics.

Figure 5A:
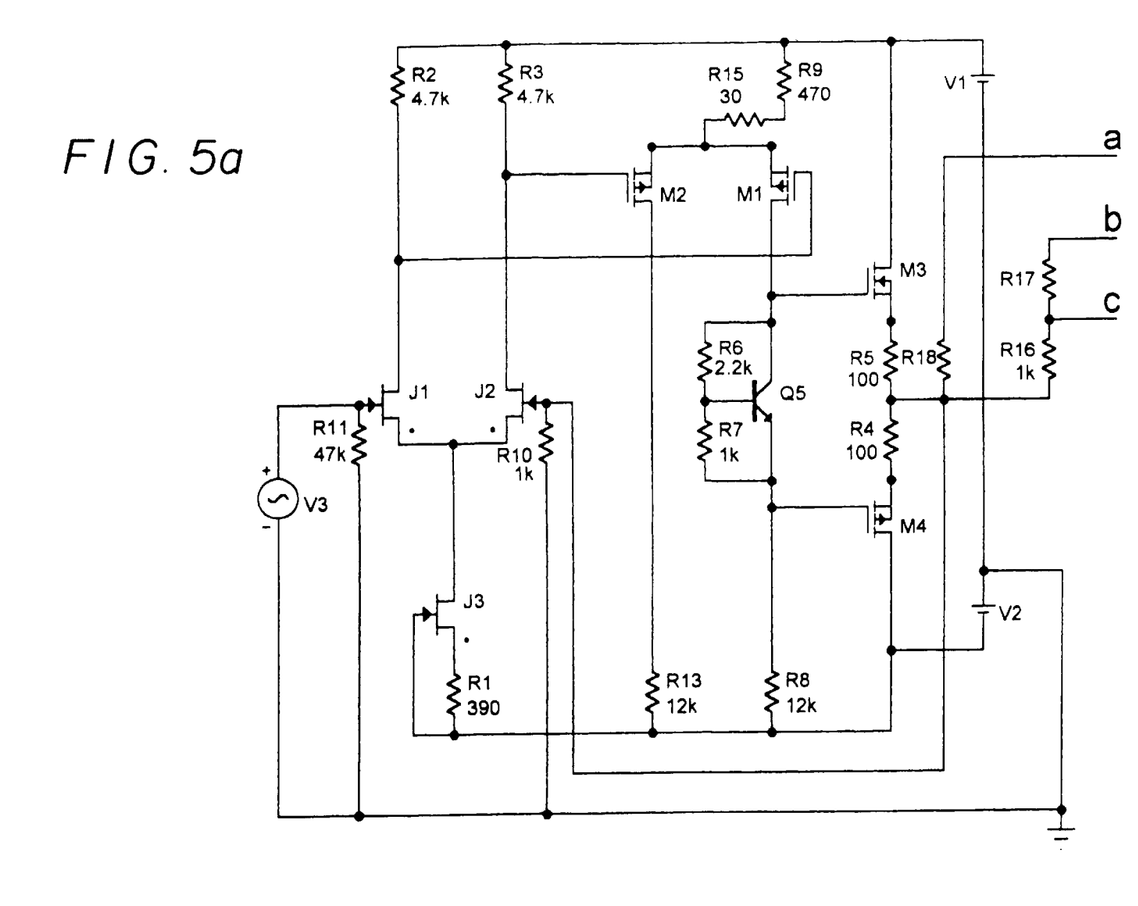
FIGS. 5a, 5b, and 5c include a detailed schematic circuit diagram illustrating one way of implementing the present invention.
Figure 5B:
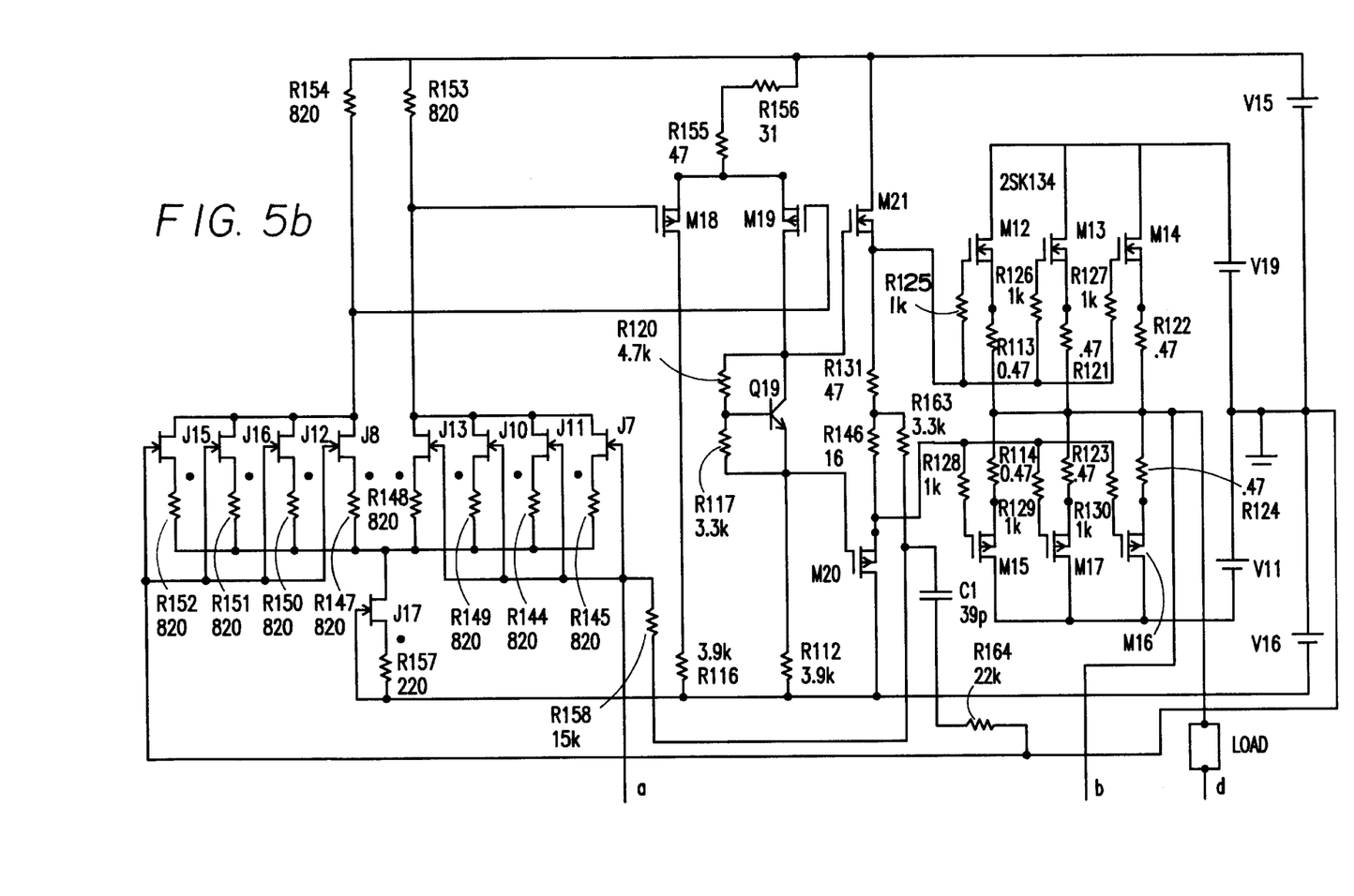
Figure 5C:
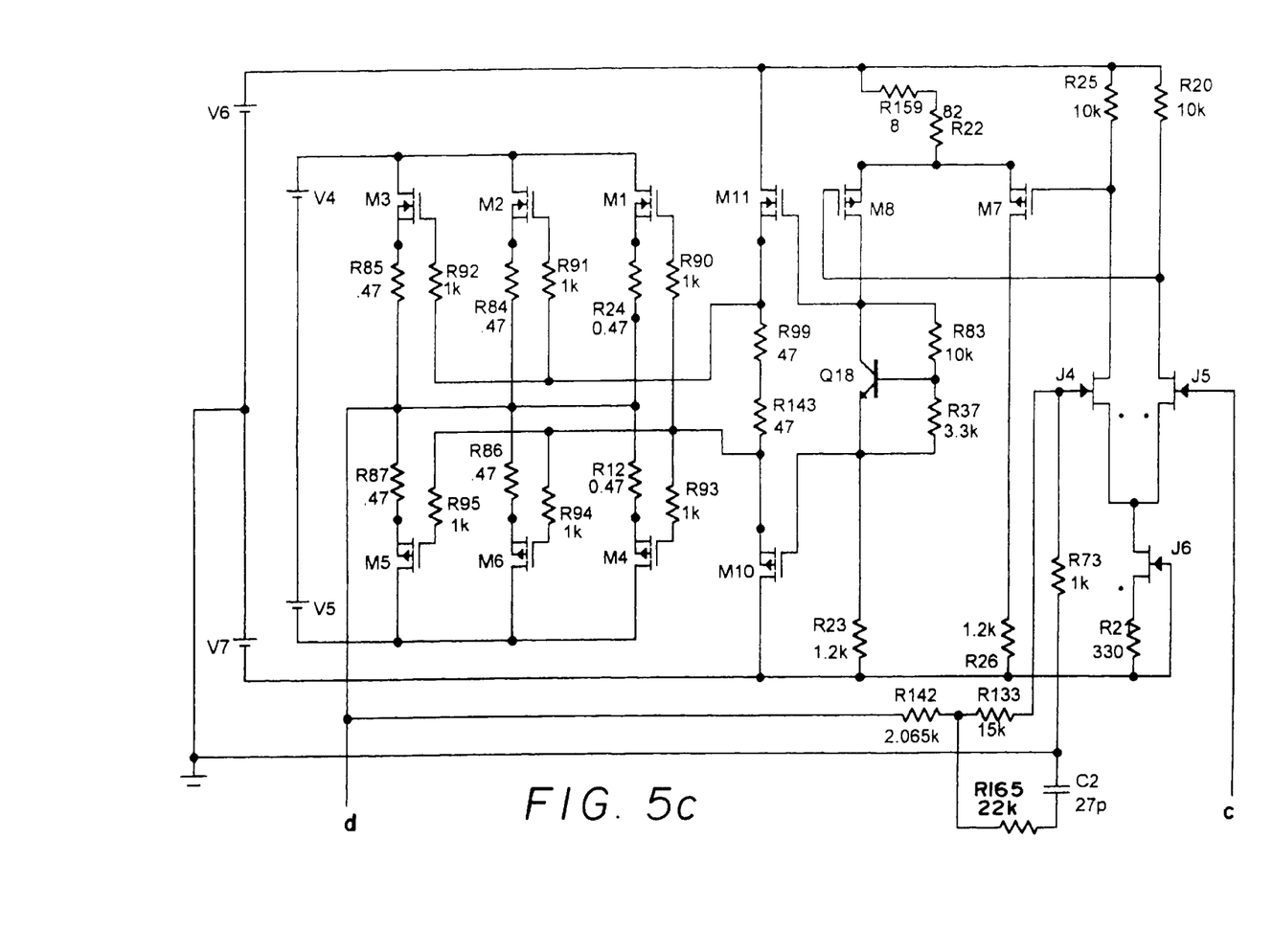

While it should clear that the above description is sufficient for any one of ordinary skilled in the art to make and use the present invention, a detailed circuit schematic is provided in FIGS. 5a, 5b, and 5c as a way of showing one of the many ways the present invention can be implemented. Note that the lines marked "a", "b", and "c" in FIG. 5a connect to their respective lines in FIGS. 5b and 5c, and the line marked "d" in FIG. 5b connects to one marked the same in FIG. 5c. Clearly, this figure is provided here for illustration purposes only, and is not intended to limit the scope of the present invention to this particular implementation.

Figure 6:
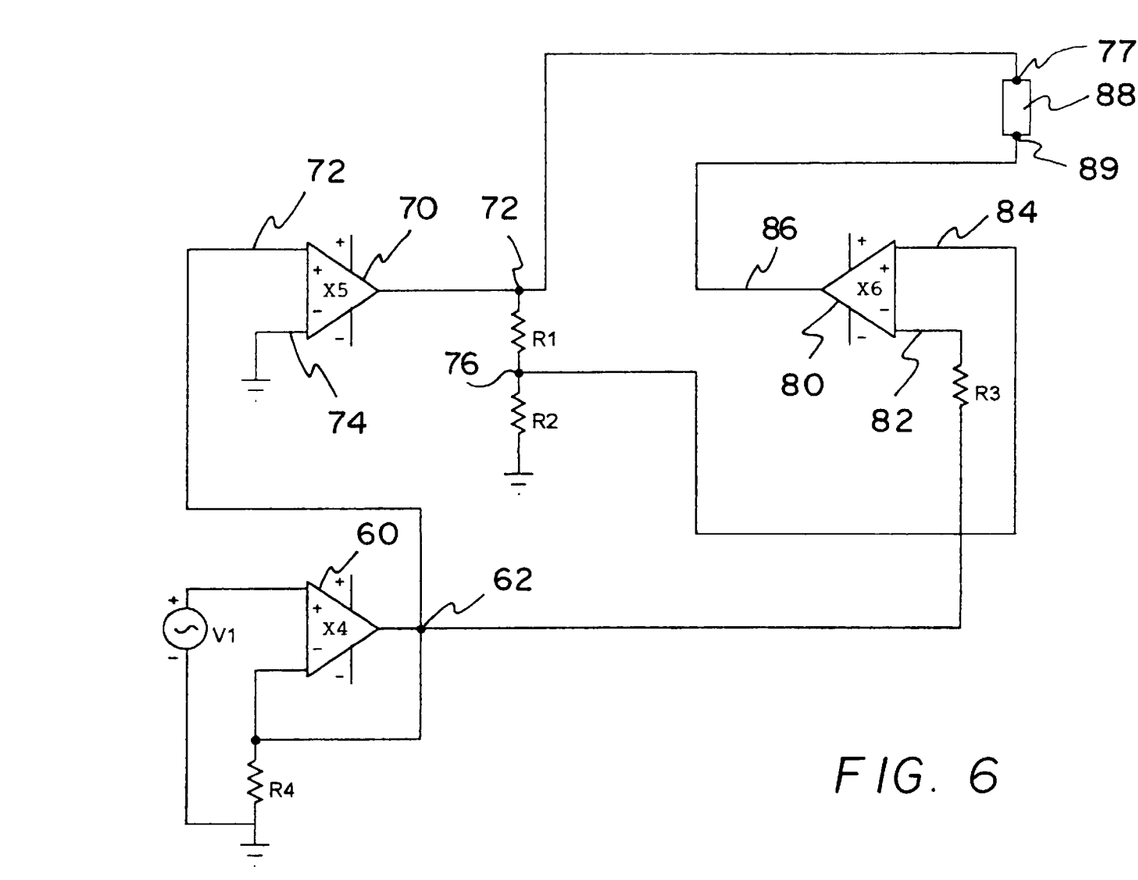
FIG. 6 shows a block diagram illustrating an alternative embodiment of the present invention.

The present invention may be embodied in other specific forms without departing from the spirit or essential characteristics thereof. For instance, FIG. 6 shows an alternative embodiment which is a slightly different implementation of the present invention, but which still utilizes the same principles as the embodiment described above. Because there are substantial similarities between the two embodiments, only the differences will be briefly described.

In the embodiment shown in FIG. 6, the circuit still utilizes a buffer or reference amplifier X4, 60, a main power amplifier X5, 70, and an error suspension amplifier X6, 80. The main differences between the circuit of FIG. 6 and that of FIG. 1, are that the main power amplifier X5 is now a non-inverting amplifer; that the error suspension amplifier X6 is now a dual input differential amplifier rather than a single input differential amplifier, and that the isolated error signal is isolated at the error suspension amplifier X6 instead of the external circuitry.

In further referring to FIG. 6, the output 62 of the amplifier X4 is now connected to the positive input 72 of the amplifier X5, and the negative input 74 of the amplifier X5 is tied to the ground. Unlike the circuit in FIG. 1, the output 62 is no longer connected to the resistor R2, but rather connected to the negative input 82 of the amplifier X6 via a resistor R3. The positive input 84 of the amplifier X6 is still connected to the point 76 between the resistors R1 and R2.

In this topology, the negative input 82 of the amplifier X6 carries the reference signal without any error or distortion, while the positive input 84 does carry the error signal. Therefore, the signal at the output 86 is the amplified isolated error signal, or the error-canceling signal, just as was in the circuit of FIG. 1. The error-canceling signal is applied to the terminal 89 at the load 88 to cancel out the error signal in the main amplified signal which is the output 72 of the amplifier X5 which is connected to the other terminal 77 of the load 88.

It is clear from this example that the present invention may be implemented in a multitude of while still utilizing the same principles of the present invention. The presently disclosed embodiments are, therefore, to be considered in all respects as Illustrative and not restrictive, the scope of the invention being indicated by the appended claims and all changes which come within the meaning and range of equivalency of the claims are, therefore, to be embraced therein.

I claim:

1. An audio amplifier circuit comprising:
   a reference amplifier for receiving an incoming signal and outputting a reference signal substantially identical to said incoming signal;
   an inverting main amplifier for inverting and amplifying said reference signal from said reference amplifier and outputting an inverted main signal;
   a means for normalizing said reference signal and inverted main signal to yield a normalized reference signal and a normalized inverted main signal;
   a means for mixing said normalized reference signal and said normalized inverted main signal and outputting an isolated error signal; and
   an error suspension amplifier for receiving and amplifying said isolated error signal and outputting an error-canceling signal;
      wherein said error-canceling signal is delivered to one terminal of a load and said inverted main signal is delivered to a second terminal of said load such that any error in said main signal is canceled out by said error-canceling signal.

2. The audio amplifier circuit as recited in claim 1 wherein said load is a speaker.

3. The audio amplifier circuit as recited in claim 1 wherein said means for normalizing comprises a set of resistors in series.

4. The audio amplifier circuit as recited in claim 1 wherein said means for mixing comprises a set of resistors in series.

5. The audio amplifier circuit as recited in claim 3 wherein said means for mixing comprises the set of resistors in series used for said means for mixing.

6. The audio amplifier circuit as recited in claim 1 wherein at least one of said reference amplifier, main power amplifier, or error suspension amplifier is a tube amplifier.

7. The audio amplifier circuit as recited in claim 1 wherein at least one of said reference amplifier, main power amplifier, or error suspension amplifier is solid-state amplifier.

8. An audio amplifier circuit comprising:
   a reference amplifier for receiving an incoming signal and outputting a reference signal substantially identical to said incoming signal;
   a main amplifier for amplifying said reference signal from said reference amplifier and outputting a main signal;
   a means for normalizing said reference signal and said main signal;
   an error suspension amplifier for receiving said reference signal as first input and a normalized main signal as a second input, and outputting an error-canceling signal;
      wherein said error-canceling signal is delivered to one terminal of a load and said main signal is delivered to a second terminal of said load such that any error in said main signal is canceled out by said error-canceling signal.

9. A method of amplifying an audio signal without errors comprising:
   providing a reference signal substantially equal to said audio signal;
   amplifying and inverting said reference signal to yield inverted main signal;
   normalizing said reference signal and said inverted main signal to yield a normalized reference signal and normalized inverted main signal;
   mixing said normalized reference signal and said normalized inverted main signal to yield an isolated error signal;
   amplifying said isolated error signal to yield an error-canceling signal; and
      providing said inverted main signal to a first terminal of a load; and
      providing said error-canceling signal to a second terminal of a load,
      such that any error in the inverted main signal is canceled out by said error-canceling signal.

10. The method as recited in claim 8 wherein said load is a speaker.

11. A method of amplifying an audio signal without errors comprising:
   providing a reference signal substantially equal to said audio signal;
   providing an inverted reference signal, said inverted reference signal being an inverted form of said reference signal;
   amplifying said reference signal to yield a main signal;
   normalizing said inverted reference signal and said main signal;
   mixing said normalized inverted reference signal and said normalized main signal to yield isolated error signal;
   normalizing said isolated error signal to yield error-canceling signal;
   providing said main signal to a first terminal of a load; and
   providing said error-canceling signal to a second terminal of a load,
      such that any error in the main signal is canceled out by said error-canceling signal.

12. A method of amplifying an audio signal without errors comprising:
   providing a reference signal substantially equal to said audio signal;

amplifying said reference signal to yield a main signal;

normalizing said main signal to yield a normalized main signal;

applying said reference signal to a first input of a differential amplifier and said normalized main signal to a second input of said differential amplifier to yield an error-canceling signal;

providing said main signal to a first terminal of a load; and providing said error-canceling signal to a second terminal of a load, such that any error in the main signal is canceled out by said error-canceling signal.

* * * * *

UNITED STATES PATENT AND TRADEMARK OFFICE
CERTIFICATE OF CORRECTION

| | | |
|---|---|---|
| PATENT NO. | : 6,046,634 | Page 1 of 1 |
| APPLICATION NO. | : 09/160687 | |
| DATED | : April 4, 2000 | |
| INVENTOR(S) | : Jun Makino | |

It is certified that error appears in the above-identified patent and that said Letters Patent is hereby corrected as shown below:

Column 4, line 3: "amplifier 16" should read --amplifier X2--.

Column 5, line 26: "where Gv" should read --where GvX1--.

Column 5, line 50: "V4=GvX2*f(t)" should read --V4= -GvX2*f(t)--.

Column 5, line 59: "V4=GvX2*f(t)" should read --V4= -GvX2*f(t)--.

Column 6, line 31: "=GvX2*f(t)" should read --= -GvX2*f(t)--.

Column 6, line 33: "=GvX2*f(t)" should read --= -GvX2*f(t)--.

Column 7, line 22: "72 of the amplifier" should read --73 of the amplifier--.

Signed and Sealed this

Fifth Day of June, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,046,634 |
| APPLICATION NO. | : 09/160687 |
| DATED | : April 4, 2000 |
| INVENTOR(S) | : Makino |

It is certified that error appears in the above-identified patent and that said Letters Patent is hereby corrected as shown below:

Delete drawing sheet 9, and substitute therefor drawing sheet 9. (attached).

Signed and Sealed this

Twenty-ninth Day of June, 2010

David J. Kappos
*Director of the United States Patent and Trademark Office*

FIG. 6